(12) United States Patent
Takimoto et al.

(10) Patent No.: US 6,707,081 B2
(45) Date of Patent: Mar. 16, 2004

(54) PHOTODETECTOR WITH BUILT-IN CIRCUIT

(75) Inventors: Takahiro Takimoto, Nara (JP); Isamu Okubo, Nara (JP); Toshimitsu Kasamatsu, Nara (JP); Masaru Kubo, Nara (JP); Zenpei Tani, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 72 days.

(21) Appl. No.: 09/921,777

(22) Filed: Aug. 6, 2001

(65) Prior Publication Data
US 2002/0030206 A1 Mar. 14, 2002

(30) Foreign Application Priority Data

Sep. 8, 2000 (JP) ......................... 2000-274086

(51) Int. Cl.⁷ ...................... H01L 31/062; H01L 31/113
(52) U.S. Cl. ........................ 257/292; 257/290
(58) Field of Search .................. 257/292, 290

(56) References Cited

U.S. PATENT DOCUMENTS

| 4,860,074 A | 8/1989 | Overhauser et al. |
| 5,747,860 A | 5/1998 | Sugiyama et al. |
| 6,114,740 A | 9/2000 | Takimoto et al. |
| 6,150,682 A * | 11/2000 | Sawada et al. ............ 257/290 |

FOREIGN PATENT DOCUMENTS

| CN | 1185659 | 6/1998 |
| EP | 0 940 854 | 9/1999 |
| JP | 7-231113 | 8/1995 |
| JP | 07-231113 | * 8/1995 |
| JP | 10-084102 | 3/1998 |
| JP | 10-107243 | 4/1998 |
| JP | 10-209411 | 8/1998 |
| JP | 2000-2000894 | 7/2000 |
| JP | 2001-044484 | 2/2001 |

* cited by examiner

Primary Examiner—Amir Zarabian
Assistant Examiner—Kiesha Rose
(74) Attorney, Agent, or Firm—Nixon & Vanderhye P.C.

(57) ABSTRACT

A photodetector with a built-in circuit includes a semiconductor substrate, an integrated circuit provided on the semiconductor substrate, and a photodiode provided on the semiconductor substrate. The integrated circuit includes a SiGe layer provided on at least a portion of the integrated circuit.

12 Claims, 16 Drawing Sheets

PHOTODETECTOR WITH BUILT-IN CIRCUIT

BACKGROUND OF THE INVENTION

1. Field of the Invention

The present invention relates to a photodetector with a built-in circuit, in which a photodiode for converting incident light into an electric signal and an integrated circuit for processing the converted signal are provided on the same silicon substrate, and to a method for producing such a photodetector.

2. Description of the Related Art

Photodetectors with a built-in circuit are used in a wide range of applications such as, particularly, optical pickups and optical space transmission. In optical pickups, photodetectors with a built-in circuit are used to detect a focus error signal for adjusting a focal position of semiconductor laser light on a disk or a radial error signal for adjusting a focal position of semiconductor laser light to a pit in the disk (i.e., tracking). In recent years, there has been an increasing demand for an improvement in speed and sensitivity of photodetectors with a built-in circuit.

FIG. 16 shows a conventional photodetector with a built-in circuit disclosed in Japanese Laid-Open Publication No. 10-107243. A photodetector with a built-in circuit 600 includes a P-type semiconductor substrate 603, a photodiode 601, and an integrated circuit 602. The photodiode 601 includes a P-type buried isolation diffusion layer 102A, an N-type buried diffusion layer 103A, an N-type epitaxial layer 104, a P-type isolation diffusion layer 105A, a P-type diffusion layer 107, a silicon thermal oxide film 111, and a silicon nitride film 112. The integrated circuit 602 includes a P-type buried isolation diffusion layer 102B, an N-type buried diffusion layer 103B, the N-type epitaxial layer 104, a P-type isolation diffusion layer 105B, a collector compensation diffusion layer 106, an NPN transistor external base diffusion layer 109, an NPN transistor internal base diffusion layer 108, an NPN transistor emitter diffusion layer 110, the silicon thermal oxide film 111, the silicon nitride film 112, a first-layer conductor 113, an interlayer insulation film 114, a second-layer conductor 115, and a silicon nitride film 116.

In order to speed up the photodiode 601, it is necessary to reduce a diffusion current components and a CR time constant component both of which have slow response. The diffusion current component is reduced by providing the N-type buried diffusion layer 103A and the P-type diffusion layer 107 in the neighborhood of an isolation portion (i.e., the P-type buried isolation diffusion layer 102A and the P-type isolation diffusion layer 105A, respectively). The CR time constant component is reduced by decreasing the capacitance $C_{PD}$ of the photodiode 601. Therefore, the N-type buried diffusion layer 103A and the P-type diffusion layer 107 are each designed to have as small a size as possible but at which practical use is still allowable. The P-type diffusion layer 107 is provided in a region which is irradiated with a laser beam reflected from a disk (not shown) when reading a signal from the disk.

An antireflection film is provided on a light receiving surface of the photodiode 601 so as to improve sensitivity of the photodiode 601. The silicon thermal oxide film 111 and the silicon nitride film 112 form a laminated layer which serves as the antireflection film.

The silicon thermal oxide film 111 needs to be provided on the light receiving surface of the photodiode 601. This is because a junction surface of the P-type diffusion layer 107 and the N-type epitaxial layer 104 reaches the light receiving surface of the photodiode 601, so that there occurs a leakage current on the light receiving surface.

The silicon thermal oxide film 111 and the silicon nitride film 112 are provided in such a manner as to have a low reflectance with respect to laser wavelengths used for CD-ROMs and DVD-ROMs (i.e., 780 nm and 650 nm, respectively).

In the integrated circuit 602, device isolation is achieved by diffusion isolation. The NPN transistor external base diffusion layer 109 and the NPN transistor internal base diffusion layer 108 are formed by implantation of boron (B+) ions. The NPN transistor emitter diffusion layer 110 is formed by implantation of arsenic (As+) ions. The thus-constructed NPN transistor has a maximum frequency (fTmax) of 3 GHz, and a response of as high as 60 MHz for a photodetector with a built-in circuit.

However, there is a demand for even higher-speed photodetectors with a built-in circuit. To meet the demand, production methods of Poly-Si emitters, Poly-Si bases, emitters having a double polysilicon structure, and the like have been developed.

Among transistors having such structures, heterojunction bipolar transistors (hereinafter referred to as "HBT") which employ a heterojunction such as Si/SiGe have drawn attention in recent years. In the HBT, an emitter-base junction is formed between two substances having different bandgaps (e.g., Si and SiGe). The HBT allows a barrier height against holes injected from a base into an emitter to be higher than that against electrons injected from the emitter into the base, so that carrier density in the base region can be increased without decreasing the efficiency of injection from the base into the emitter. Accordingly, the HBT allows base resistance, which is increased due to miniaturization, to be decreased, thereby speeding up the transistor.

In an attempt to obtain a high-speed photodetector with a built-in circuit, the photodiode 601 shown in FIG. 16 and the integrated circuit 602 sped up by employing the HBT may be provided on the same P-type semiconductor substrate 603. In this case, however, there arises the following problem.

For the photodiode 601 of FIG. 16 in which a PN junction of the P-type diffusion layer 107 and the N-type epitaxial layer 104 are formed, if a film deposited by CVD or the like is provided as an antireflection film on the light receiving surface of the photodiode 601, leakage current is increased on the surface of the photodiode 601. To avoid this, the silicon thermal oxide film 111 as an antireflection film is required.

As explained above, diffusion layers 108 and 109 in Prior Art FIG. 16 are formed by implantation of boron (B+) ions (they are not made of SiGe). However, in order to explain certain embodiments of the instant invention, if SiGe layers were to be provided as the NPN transistor external base diffusion layer 109 and the NPN transistor internal base diffusion layer 108 of the integrated circuit 602 (HBT), such layers may have a strain caused by lattice mismatch due to a difference in a lattice constant between Si and Ge. Accordingly, when the SiGe layers are formed at a high temperature, dislocation occurs at an interface between the Si layer and the SiGe layer, thereby increasing a generation recombination current.

In the case where the silicon thermal oxide film 111, which serves as the antireflection layer, is formed after the formation of the SiGe layer, strain energy held in the strain caused by the lattice mismatch of the SiGe layer is released. This leads to lattice relaxation which triggers the occurrence of dislocation, so that junction leakage characteristics of the NPN transistor of the integrated circuit 602 are deteriorated. Moreover, the composition of the SiGe layer is changed such that the resultant SiGe layer does not have desired characteristics (e.g., bandgap).

After the NPN transistor external base diffusion layer 109 and the NPN transistor internal base diffusion layer 108 are formed, the NPN transistor emitter diffusion layer 110, the first-layer conductor 113, and the second-layer conductor 115 are formed. Typically, dry etching is used to etch Poly-Si when forming the NPN transistor emitter diffusion layer 110. Dry etching is also used to etch AlSi which is usually used as a material for the first-layer conductor 113 and the second-layer conductor 115. The silicon nitride film 116 is etched with a gas. For example, the silicon nitride film 116 is made thinner at a rate of 4–5 nm per minute by the gas used in etching AlSi. As a result, the thickness of the silicon nitride film 116 departs from an optimum thickness for a low reflectance.

SUMMARY OF THE INVENTION

According to the present invention, there is provided a photodetector with a built-in circuit which includes a semiconductor substrate, an integrated circuit provided on the semiconductor substrate, and a photodiode provided on the semiconductor substrate. The integrated circuit includes a SiGe layer provided on at least a portion of the integrated circuit. Thus, the above described objective is achieved.

The photodiode may include a homojunction of Si.

The photodiode may include a plurality of split photodiodes.

The photodiode may include an antireflection film provided on the semiconductor substrate and the antireflection film may include a silicon thermal oxide film.

The antireflection film may further include a silicon nitride film.

A thickness of the silicon thermal oxide film may be between about 10 nm or more and about 40 nm or less.

The semiconductor substrate may include a first conductivity-type semiconductor having a high resistivity.

The semiconductor substrate may include a first conductivity-type semiconductor substrate having a low resistivity and a first conductivity-type epitaxial layer provided on the first conductivity-type semiconductor substrate which has a resistivity higher than that of at least the first conductivity-type semiconductor substrate.

The semiconductor substrate may include a first conductivity-type semiconductor substrate having a low resistivity, a first conductivity-type semiconductor layer provided on the first conductivity-type semiconductor substrate which has a resistivity lower than that of at least the first conductivity-type semiconductor substrate, and a first conductivity-type epitaxial layer provided on the first conductivity-type semiconductor layer which has a resistivity higher than that of at least the first conductivity-type semiconductor substrate.

According to the present invention, there is provided a method for producing a photodetector with a built-in circuit. The photodetector with a built-in circuit includes a semiconductor substrate, an integrated circuit formed on the semiconductor substrate, and a photodiode provided on the semiconductor substrate. The integrated circuit includes a SiGe layer formed on at least a portion of the integrated circuit. The method includes the steps of: a) forming the photodiode on the semiconductor substrate; and b) forming the SiGe layer after the photodiode is formed. Thus, the above described objective is achieved.

The photodiode may include an antireflection layer provided on the semiconductor substrate. Step a) may include the step of c) forming the antireflection layer on the semiconductor substrate. Step c) may include the step of forming a silicon thermal oxide film on the semiconductor substrate. Step b) may include the steps of: etching the silicon thermal oxide film formed on step c); and forming the SiGe layer by low temperature MBE.

Step c) may include the steps of forming a silicon nitride film on the silicon thermal oxide film and simultaneously forming a silicon nitride film used as a silicon nitride film capacitance portion in the integrated circuit.

Step c) may include the step of forming a silicon oxide film on the silicon nitride film so as to protect the silicon nitride film.

Step c) may include the step of d) etching the silicon oxide film after all dry-etching processes are completed.

The method for producing a photodetector with a built-in circuit may further includes the step of (e) forming a cover insulation film to pattern the cover insulation film by dry-etching. Step d) may be executed after the execution of step e).

Step d) may include the step of etching the silicon oxide film while the cover insulation film functions as a protection film.

According to an aspect of the invention, the SiGe layer of an HBT is formed after the formation of a silicon thermal oxide film. Therefore, a high temperature caused by thermal treatment for forming the silicon thermal oxide film substantially does not affect the SiGe layer. As a result, the SiGe layer can be formed to have desired characteristics without undergoing a change in the composition thereof. Furthermore, since a high temperature caused by thermal treatment substantially does not affect the SiGe layer, strain energy is not released. As a result, lattice relaxation does not trigger the occurrence of dislocation, so that junction leakage characteristics of the transistor are not deteriorated. Accordingly, it is possible to obtain a high-speed and high-sensitive photodetector with a built-in circuit which includes a high-speed integrated circuit employing an HBT and a photodiode having a high sensitivity (a low reflectance).

According to another aspect of the present invention, an antireflection film is formed of a silicon thermal oxide film and a silicon nitride film formed thereon. Therefore, a photodiode having a lower reflectance and higher sensitivity can be obtained. The silicon nitride film can be formed simultaneously with a silicon nitride film used as a silicon nitride film capacitance portion without increasing the production cost.

According to still another aspect of the present invention, the thickness of the silicon thermal oxide film used as an antireflection film is between about 10 nm or more and about 40 nm or less. Therefore, the reflectance can be kept low with respect to laser beam wavelengths used for CD-ROMs and DVD-ROMs.

According to still another aspect of the invention, when the silicon nitride film is formed as an antireflection film, a protective silicon oxide film for protecting the silicon nitride film is formed thereon so as to prevent the silicon nitride film from being made thinner during dry-etching steps. Thus, increase in reflectance caused by a change from an optimal thickness of the silicon nitride film is prevented, so that the sensitivity of the photodiode is maintained.

According to still another aspect of the present invention, a protective silicon oxide film for protecting the silicon nitride film is removed by wet-etching after all the dry etching steps are performed, i.e. after the cover insulation film is patterned by the final dry etching step. Thus, the silicon nitride film as an antireflection film can be protected from all the dry etching steps.

According to still another aspect of the present invention, the cover insulation film is used as a mask when wet-etching is performed. Therefore, a photolithography step for etching the protective silicon oxide film is not required and the cost of photolithography can be kept from increasing.

According to still another aspect of the present invention, the semiconductor substrate includes a first conductivity-type semiconductor having a high resistivity. By using such a substrate, it is possible to further speed up the photodiode.

According to still another aspect of the present invention, the semiconductor substrate includes a first conductivity-type semiconductor substrate having a low resistivity, and a first conductivity-type epitaxial layer provided on the first conductivity-type semiconductor substrate which has a resistivity higher than that of at least the first conductivity-type semiconductor substrate. By using such a substrate, the capacitance and the series resistance of the photodiode both can be reduced so that a CR time constant component can be reduced. Thus, it is possible to further speed up the photodiode.

According to still another aspect of the present invention, the semiconductor substrate includes a first conductivity-type semiconductor substrate having a low resistivity, a first conductivity-type semiconductor layer provided on the first conductivity-type semiconductor substrate which has a resistivity lower than that of at least the first conductivity-type semiconductor substrate, and a first conductivity-type epitaxial layer provided on the first conductivity-type semiconductor layer which has a resistivity higher than that of at least the first conductivity-type semiconductor substrate. By using such a substrate, the capacitance and the series resistance of the photodiode both can be reduced. Moreover, photocarriers generated at a deep position are accelerated by internal field caused by the first conductivity-type semiconductor layer having a resistivity lower than that of the first conductivity-type semiconductor substrate, thereby further speeding up the photodiode.

According to still another aspect of the present invention, a high-speed integrated circuit which is sped up by employing an HBT and a high-speed and high-sensitive split photodiode can be formed on the same substrate by forming the antireflection film including the silicon thermal oxide film which is necessary for increasing the speed and sensitivity of the photodiode and the SiGe layer of an HBT. An antireflection film is formed by laminating a silicon thermal oxide film on a silicon nitride film so as to improve sensitivity of the photodiode. In such a structure, the protective silicon oxide film is formed and then wet-etched after the subsequent dry etching step. This prevents the silicon nitride film from being made thinner, thereby maintaining a high sensitivity of the photodiode.

Thus, the invention described herein makes possible the advantages of providing: a photodetector with a built-in circuit in which an integrated circuit sped up by employing an HBT which includes an SiGe layer, and split photodiodes can be provided on the same substrate; and a method for producing such a photodetector.

These and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention will be described in detail.

Figure 1:
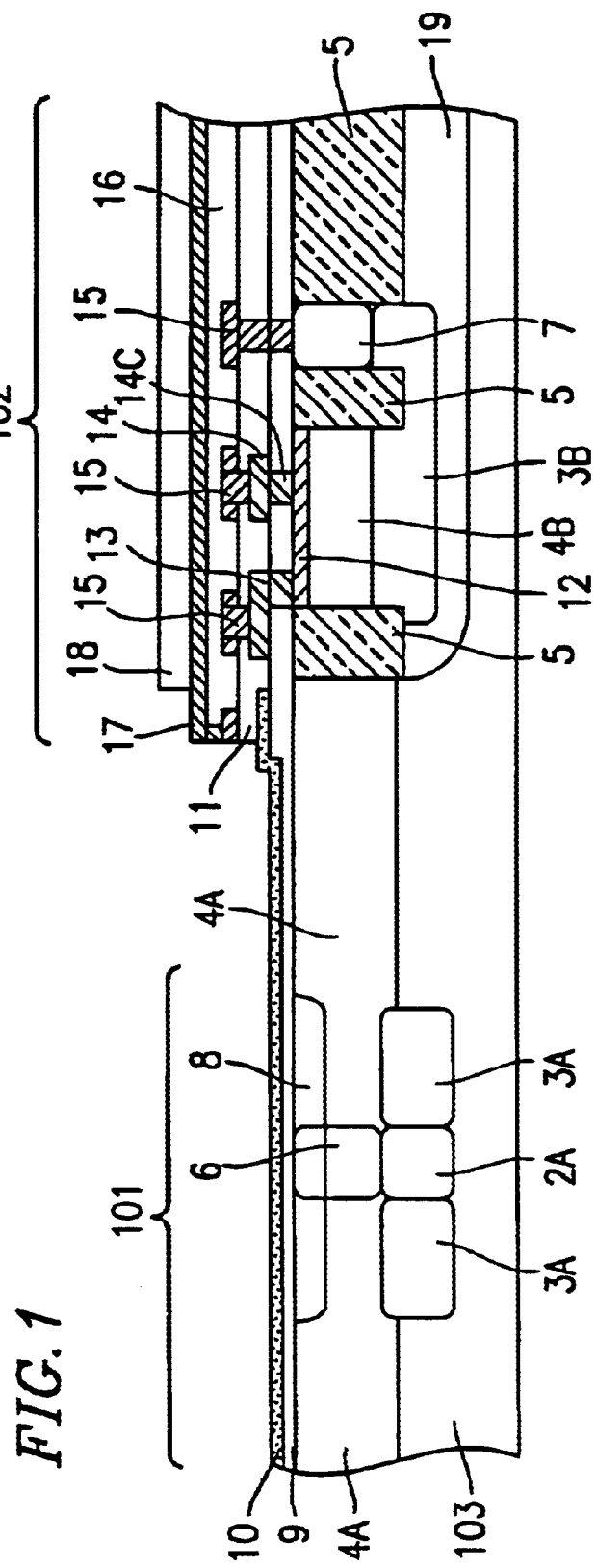
FIG. 1 is a sectional view of a photodetector with a built-in circuit (a split diode and an NPN transistor) according to an embodiment of the present invention.

FIG. 1 shows a cross-sectional view of a photodetector with a built-in circuit 100 according to an embodiment of the present invention. The photodetector with a built-in circuit 100 includes a P-type semiconductor substrate 103, a photodiode 101, and an integrated circuit 102. The photodiode 101 includes a P-type buried isolation diffusion layer 2A, an N-type buried diffusion layer 3A, a P-type isolation diffusion layer 6, an N-type epitaxial layer 4A, a P-type diffusion layer 8, a silicon thermal oxide film 9, and a silicon nitride film 10. The integrated circuit 102 includes an N-type buried diffusion layer 3B, a P-type buried diffusion layer 19, an N-type epitaxial layer 4B, a trench isolation layer 5, a collector compensation diffusion layer 7, an SiGe layer 12, the silicon nitride film 10, a CVD silicon oxide film 11, a Poly-Si layer 13 for an NPN transistor base electrode, a Poly-Si layer 14 for an NPN transistor emitter diffusion source and electrode, an NPN transistor emitter diffusion layer 14C, a first-layer conductor 15, an interlayer insulation film 16, a second-layer conductor 17, and a cover silicon nitride film 18.

The photodiode 101 includes a homojunction of Si. The term "homojunction" means a junction of the same kind of materials. The homojunction of Si means a junction of a P-type Si layer and an N-type Si layer.

In the integrated circuit 102, a heterojunction bipolar transistor (HBT) including the SiGe layer 12 is provided in a base region. The photodiode 101 is provided on the same P-type semiconductor substrate 103 on which the HBT is provided. The photodiode 101 has a diffusion structure which realizes the speedup of response and a reduction in high frequency noise.

Figure 12:
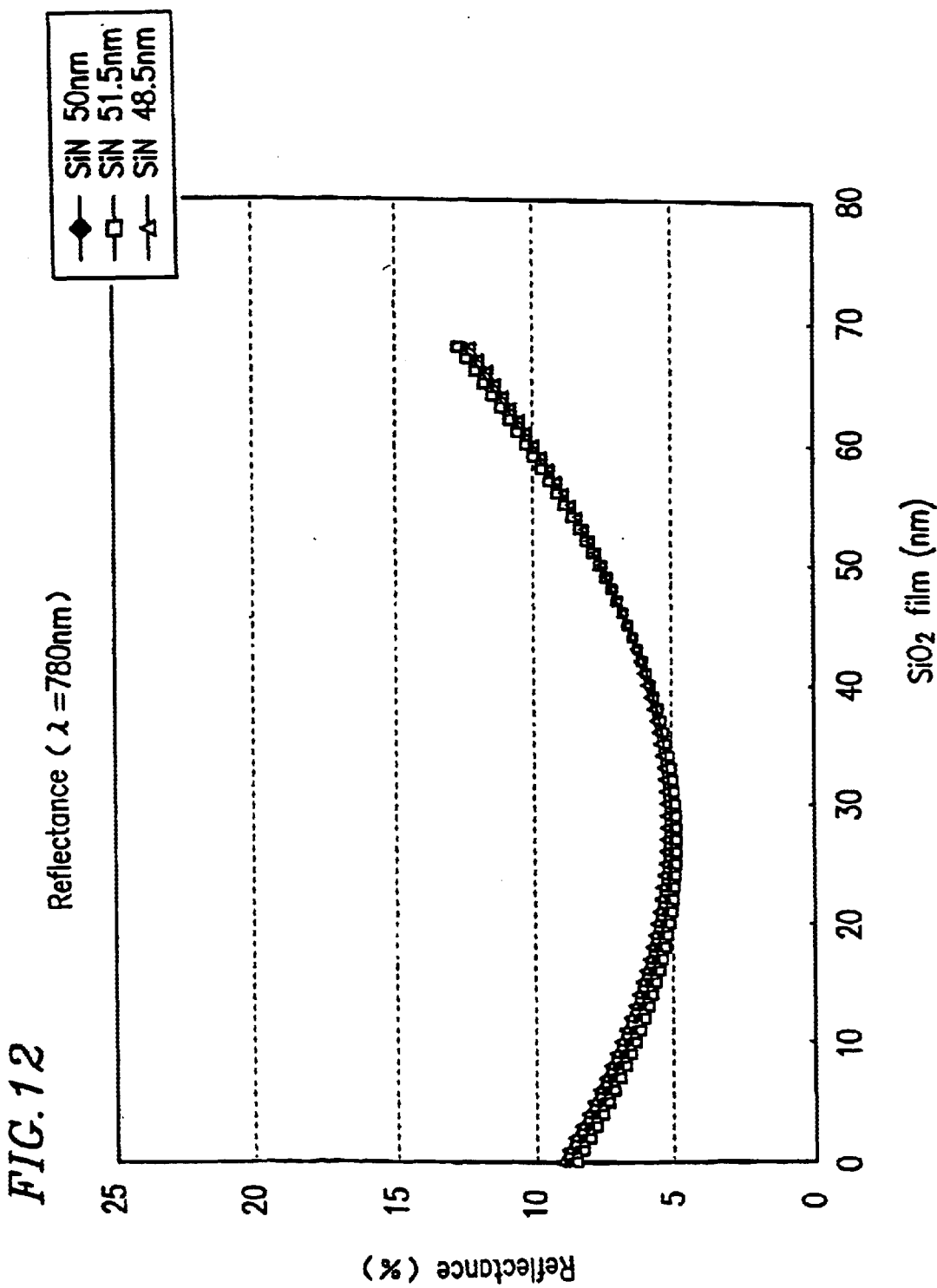
FIG. 12 is a graph showing calculation results of the reflectance with respect to a wavelength ($\lambda$=about 780 nm).
Figure 13:
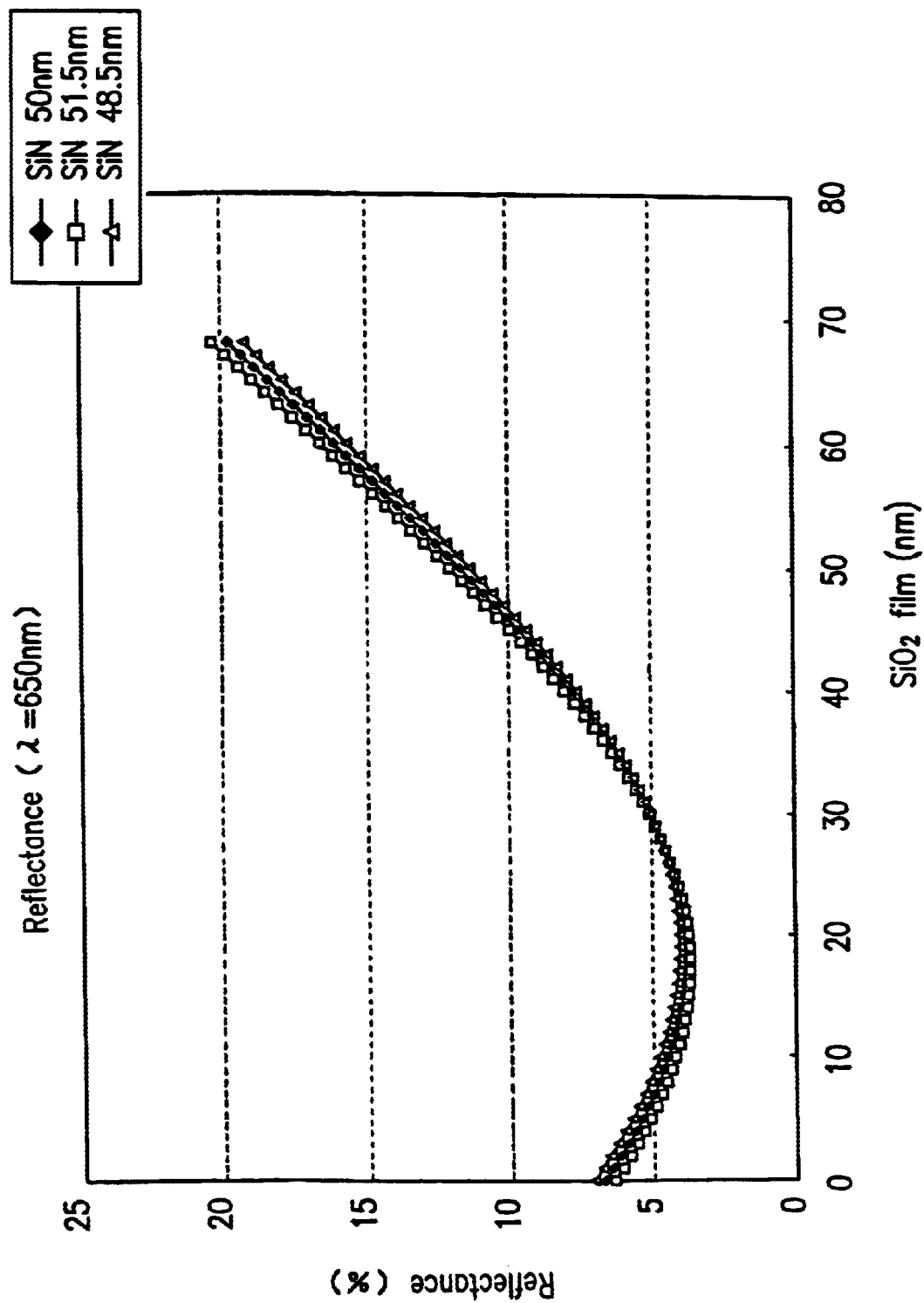
FIG. 13 is a graph showing calculation results of the reflectance with respect to a wavelength ($\lambda$=about 650 nm).
Figure 16:
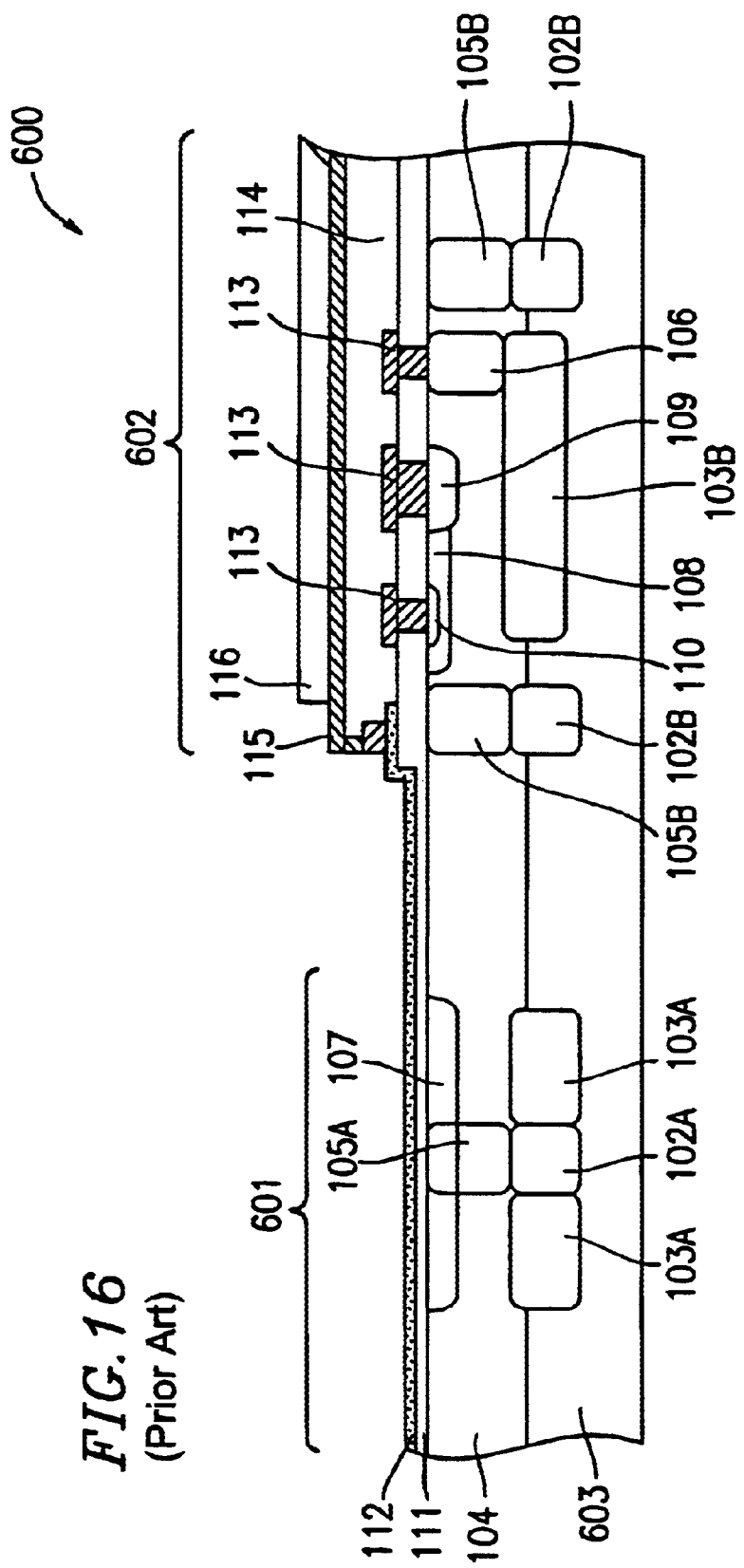
FIG. 16 is a sectional view showing a conventional a photodetector with a built-in circuit.

Specifically, in order to reduce a diffusion current component having slow response, the N-type buried diffusion layer 3A and the P-type diffusion layer 8 are provided only in the neighborhood of the P-type buried isolation diffusion layer 2A and the P-type isolation diffusion layer 6, respectively, as in the diffusion structure of the photodiode 101 shown in FIG. 16. The silicon thermal oxide film 9 (thickness: 26 nm) is provided on the surface of the photodiode 101. The silicon nitride film 10 (thickness: 50 nm) is provided on the silicon thermal oxide film 9. The silicon thermal oxide film 9 and the silicon nitride film 10 form an antireflection film which serves as an antireflection film so as to reduce leakage current on the light receiving surface of the photodiode 101. FIG. 12 is a graph showing calculation results of the reflectance with respect to a wavelength ($\lambda$=about 780 nm). FIG. 13 is a graph showing calculation results of the reflectance with respect to a wavelength ($\lambda$=about 650 nm). As shown in FIGS. 12 and 13, the thickness of the silicon thermal oxide film 9 and silicon nitride film 10 is determined in such a manner as to have a low reflectance with respect to laser beam wavelengths used for CD-ROMs and DVD-ROMs (i.e., 780 nm and 650 nm, respectively).

Figure 10:
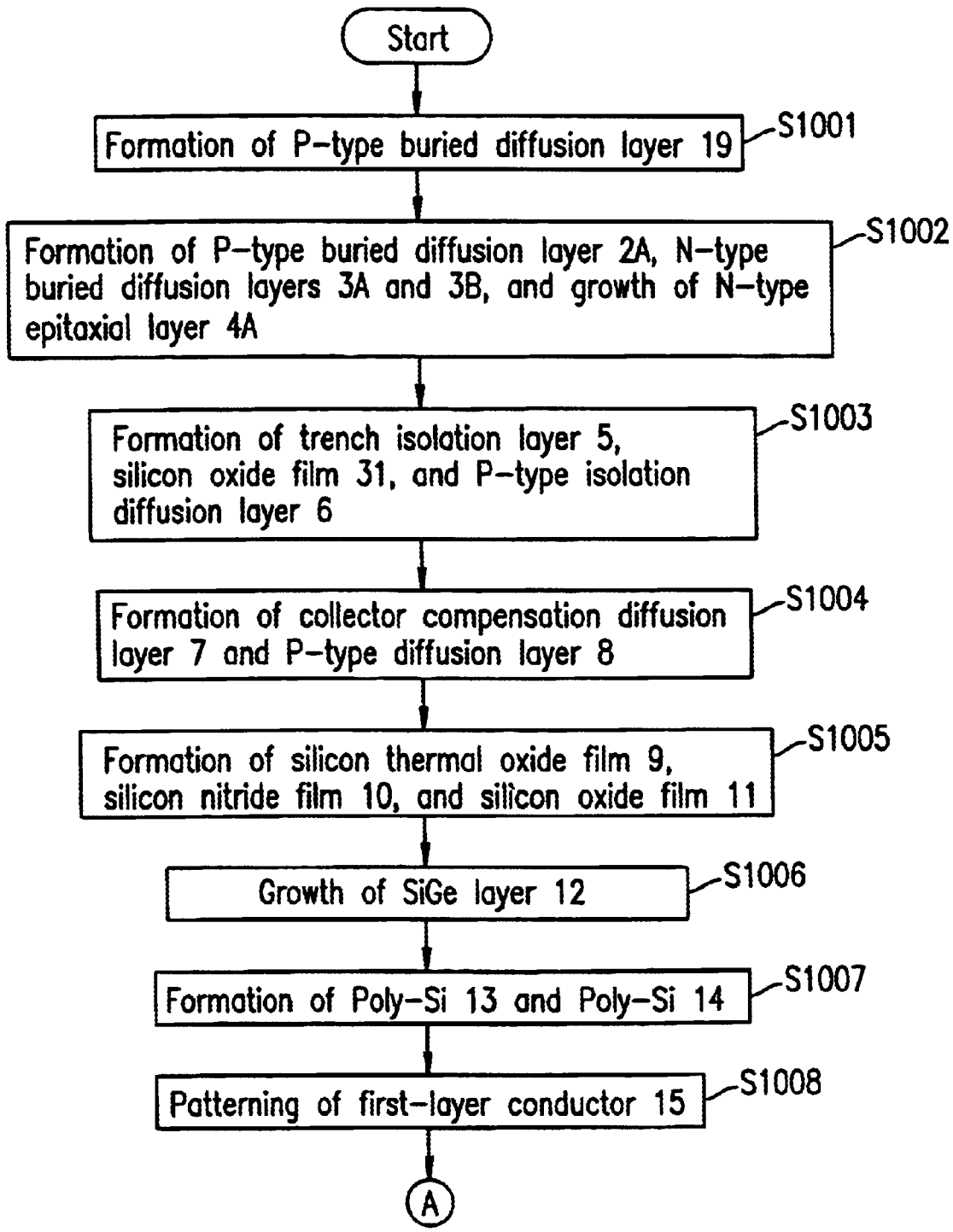
FIG. 10 is a flowchart illustrating a part of a production procedure of the photodetector with a built-in circuit 100.
Figure 11:
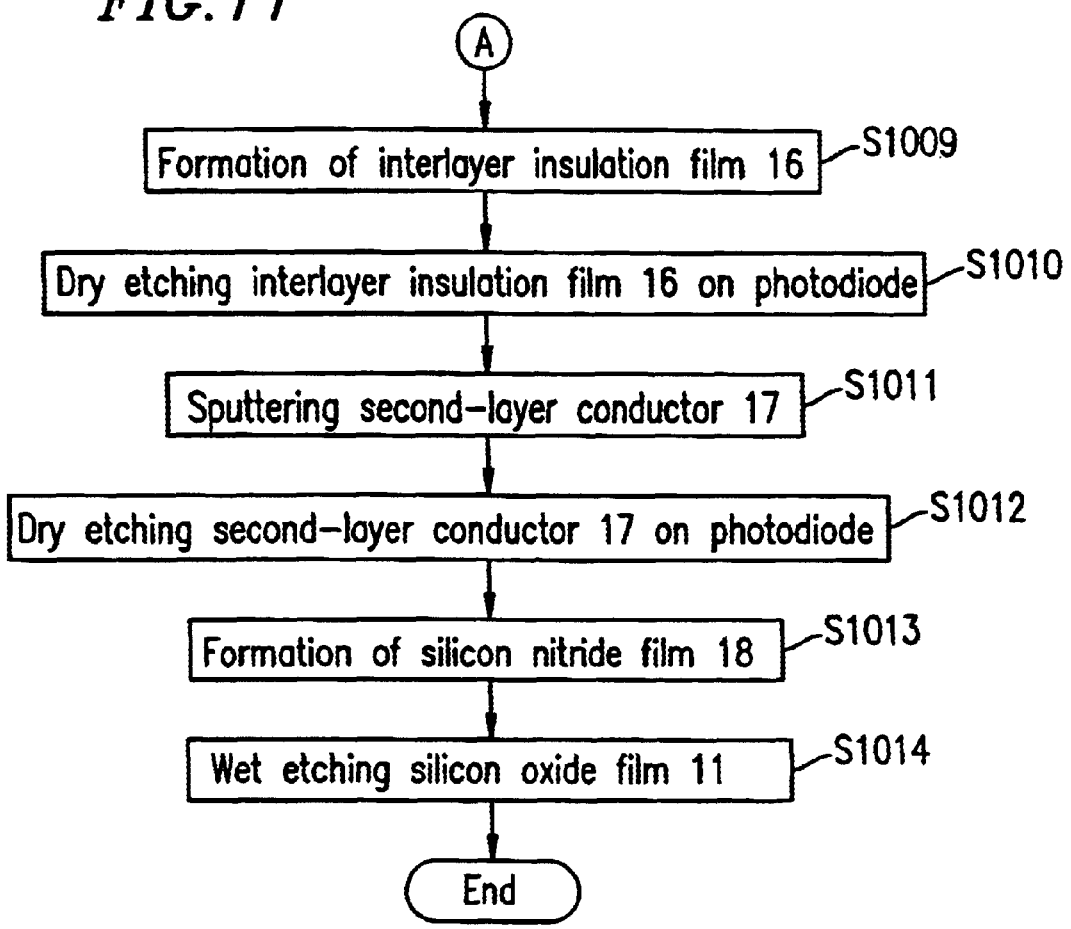
FIG. 11 is a flowchart illustrating a sequential part of a production procedure of the photodetector with a built-in circuit 100.

A method for producing the photodetector with the built-in circuit 100 according to an embodiment of the present invention will be described with reference to FIGS. 2–11 below. FIGS. 2–9 are sectional views showing different steps of the method for producing the photodetector with a built-in circuit 100. FIGS. 10 and 11 are flowcharts illustrating a production procedure of the photodetector with a built-in circuit 100.

The photodetector with the built-in circuit 100 includes a substrate having a high resistivity of about 500 $\Omega$cm. Therefore, latchup is likely to occur in the integrated circuit 102. In order to prevent the latchup, the P-type buried diffusion layer 19 (FIG. 2) having a low resistivity (about 4 $\Omega$cm) is formed on a region of the P-type semiconductor substrate 103 where the integrated circuit 102 (step S1001 of FIG. 10). (Hereinafter, the region where the integrated circuit 102 is formed is referred to as "integrated circuit region".)

Figure 2:
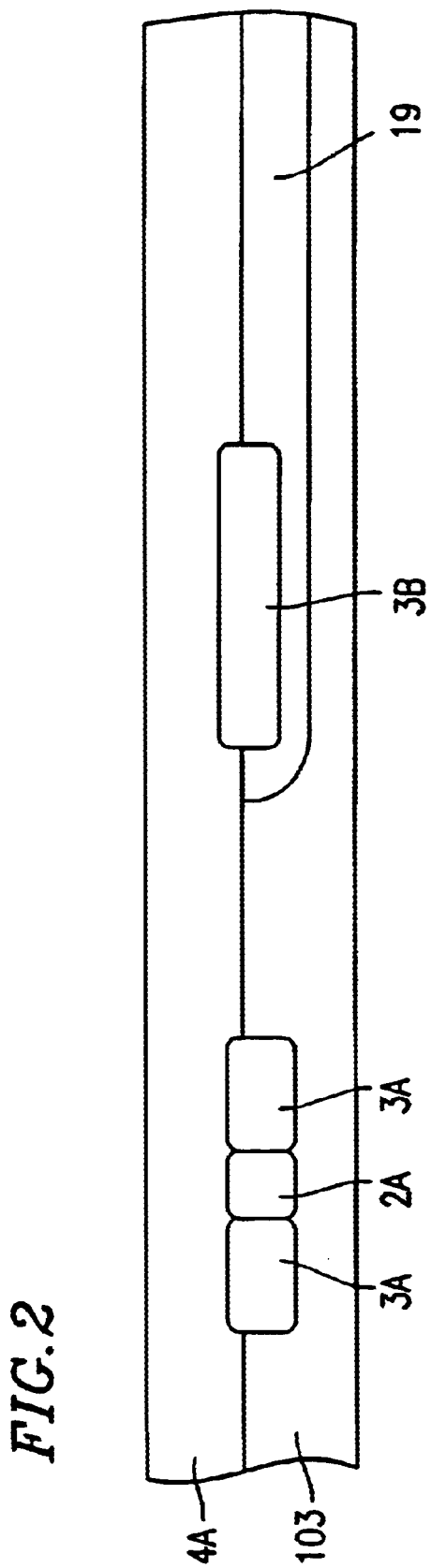
FIG. 2 is a sectional view showing a step of the method for producing the photodetector with a built-in circuit 100 according to an embodiment of the present invention.

Referring to FIG. 2, the P-type buried diffusion layer 2A and the N-type buried diffusion layer 3A are formed on a region of the P-type semiconductor substrate 103 where the photodiode 101 is to be formed. (Hereinafter, the region where the photodiode 101 is formed is referred to as "photodiode region") The N-type buried diffusion layer 3B is formed on the integrated circuit region in the P-type buried diffusion layer 19. The N-type epitaxial layer 4A is grown above the P-type semiconductor substrate 103 (step S1002 of FIG. 10).

A substrate having a high resistivity (about 500 $\Omega$cm) is used as the P-type semiconductor substrate 103 to reduce the capacitance of the photodiode 101. The N-type buried diffusion layer 3A is formed only in the neighborhood of the P-type buried diffusion layer 2A to reduce the diffusion current component, thereby achieving the speedup of the photodiode 101.

Figure 3:
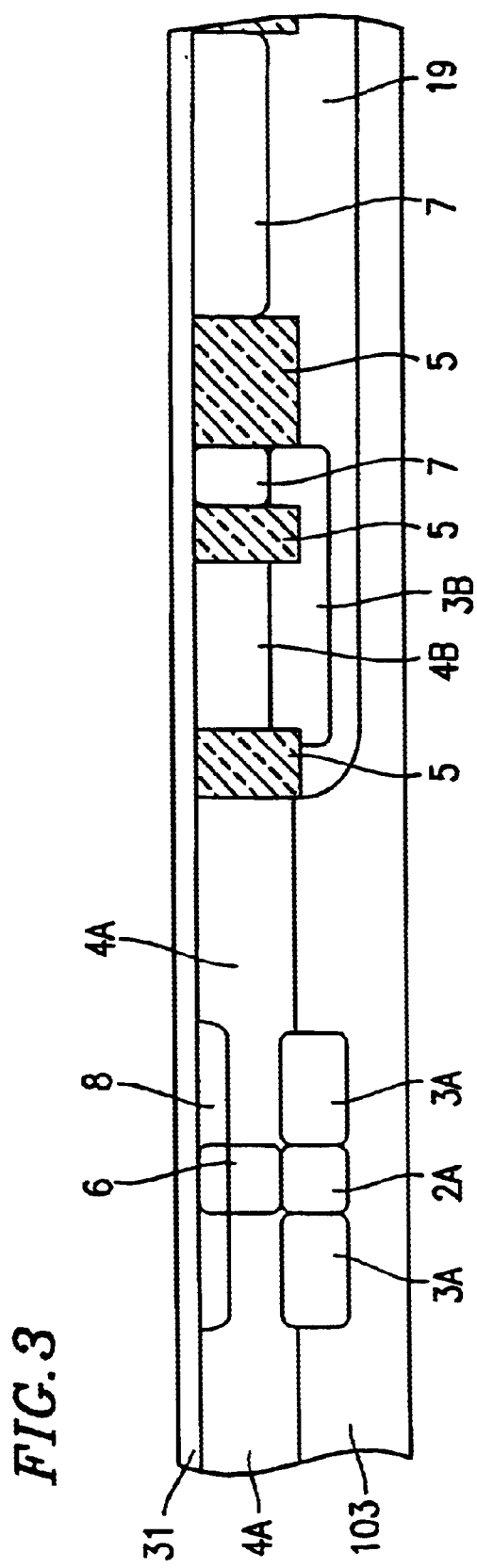
FIG. 3 is a sectional view showing a different step of the method for producing the photodetector with a built-in circuit 100 according to an embodiment of the present invention.

Referring to FIG. 3, the N-type epitaxial layer 4A is Si-etched and oxidized only in the integrated circuit region so as to form the trench isolation layer 5 and the N-type epitaxial layer 4B. Thereafter, the silicon oxide film 31 (thickness: 55 nm) is formed on the wafer surface. The P-type isolation diffusion layer 6 is formed in the photodiode region by diffusion through the silicon oxide film 31 to divide the photodiode 101 (step S1003 of FIG. 10). Furthermore, a base region of a V-PNP transistor (not shown) and the collector compensation diffusion layer 7 of the NPN transistor are formed in the circuit region, and the P-type diffusion layer 8 is formed in the photodiode region (step S1004 OF FIG. 10).

Figure 4:
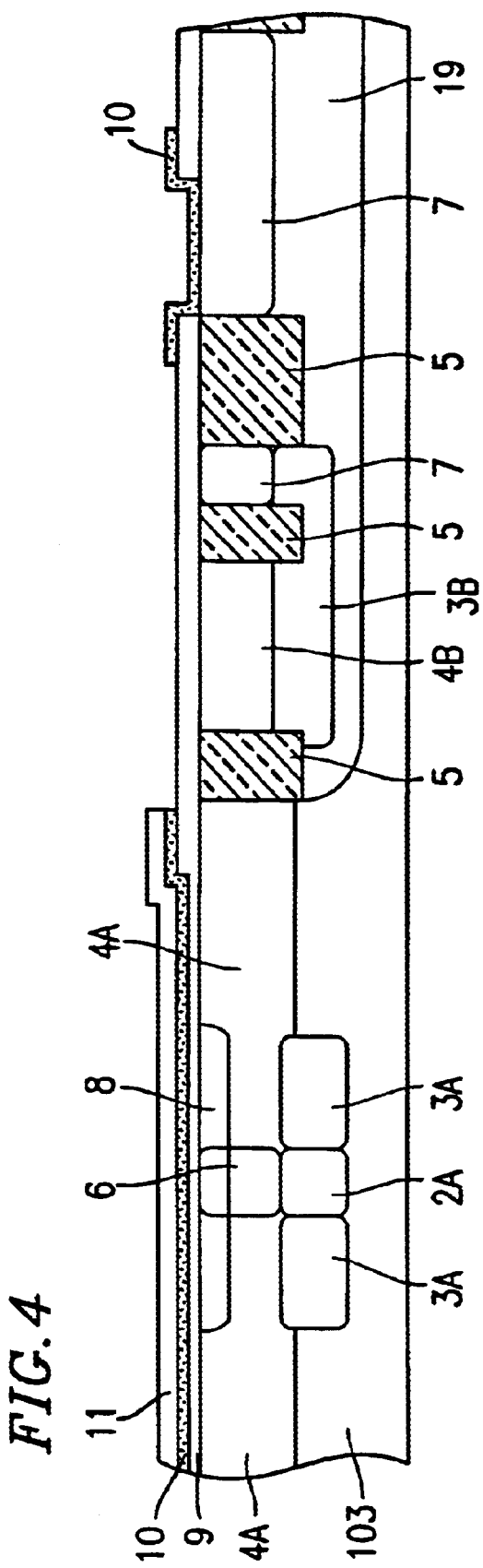
FIG. 4 is a sectional view showing a different step of the method for producing the photodetector with a built-in circuit 100 according to an embodiment of the present invention.

Referring to FIG. 4, the silicon oxide film 31 formed on the light receiving region of the photodiode 101 is removed by etching, and the silicon thermal oxide film 9 is formed to have a thickness of about 26 nm which is optimal for an antireflection film. Thereafter, the silicon nitride film 10 (about 50 nm thick) is formed to further reduce the reflectance. The silicon oxide film 11 is formed by CVD or the like so as to protect the silicon nitride film 10 from the subsequent dry etching performed for Poly-Si and a conductor (step S1005 of FIG. 10). Photolithography and etching are performed to remove the silicon nitride film 10 and the silicon oxide film 11 on the wafer excluding the light receiving region of the photodiode 101 and a portion of the integrated circuit region.

The formation of the silicon thermal oxide film 9 as an antireflection film contributes to establishment of the photodiode diffusion structure shown in FIG. 1 which is necessary for the speedup of the photodiode 101. Referring to FIGS. 12 and 13, the thickness of the silicon thermal oxide film 9 is designed so as to minimize the reflectance with respect to the wavelength ($\lambda$=about 780 nm, about 650 nm) of semiconductor laser light used for optical-pickups. When the thickness of the silicon thermal oxide film 9 is between about 10 nm or more and about 40 nm or less, the reflectance can be kept low (about 5% or less). The silicon nitride film 10 can be formed simultaneously with a silicon nitride film used as a silicon nitride film capacitance portion without increasing the production cost.

Figure 5:
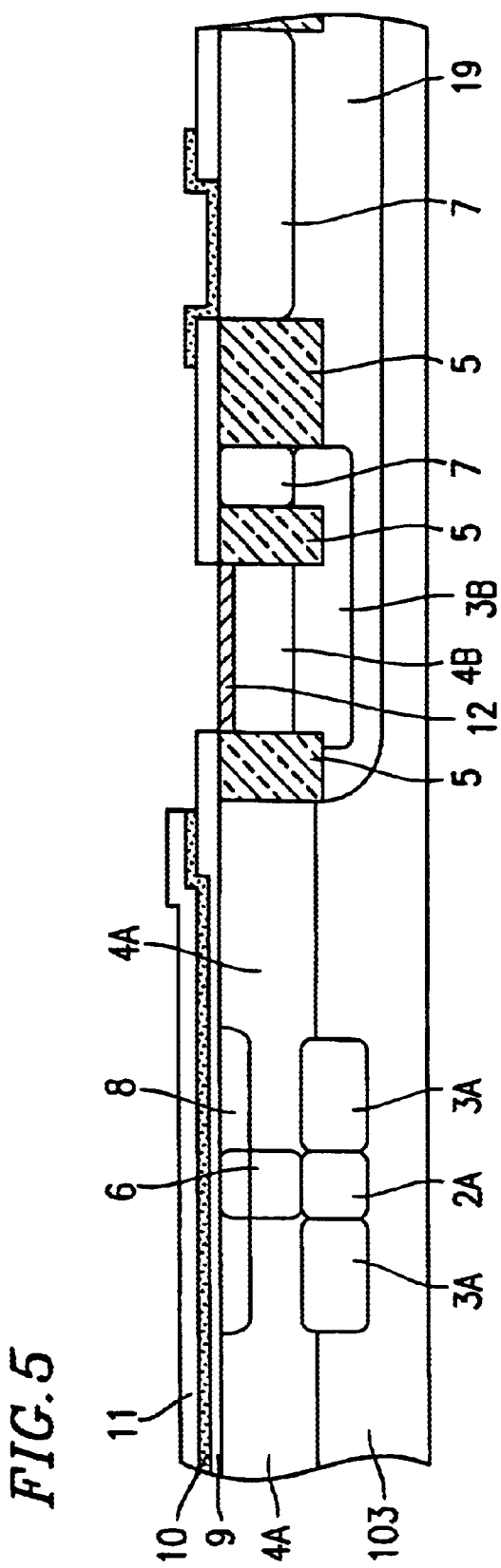
FIG. 5 is a sectional view showing a different step of the method for producing the photodetector with a built-in circuit 100 according to an embodiment of the present invention.

FIG. 5 shows steps of etching the silicon thermal oxide film 9 in the base region of the NPN transistor and growing the SiGe layer 12 so as to have a thickness of about 100 nm by low temperature MBE (about 400–650° C., preferably about 500° C.) (step S1006 of FIG. 10). The SiGe layer 12 is selectively formed only in the base region since the SiGe layer 12 does not grow in the other regions where the silicon thermal oxide film 9 remains.

MBE (Molecular Beam Epitaxy) is a physical vapor phase growth method. MBE is a method for converting a material to be grown (i.e., P-type SiGe layer in the present invention) into a molecular beam in an ultrahigh vacuum to grow crystal on a substrate.

Typical features of MBE are the following:
(1) Crystal can be grown at a low temperature since the growth is carried out in an ultra-high vacuum;
(2) The thickness of grown crystal can be adjusted since the growth rate is low;
(3) Mixed crystal including a plurality of components can be grown; and
(4) A steep gradient of carrier concentration and the formation of heterojunction can be achieved.

The above-described features of MBE are suitable for growing the SiGe layer in the present invention.

The formation of the antireflection film (silicon thermal oxide film 9 and silicon nitride film 10) of the photodiode 101 is completed by the time the SiGe layer 12 is formed. Therefore, a high temperature caused by thermal treatment for forming the silicon thermal oxide film 9 and the silicon nitride film 10 substantially does not affect the SiGe layer 12. As a result, fluctuations in characteristics, or dislocation caused by lattice relaxation substantially does not occur in the SiGe layer 12.

Figure 6:
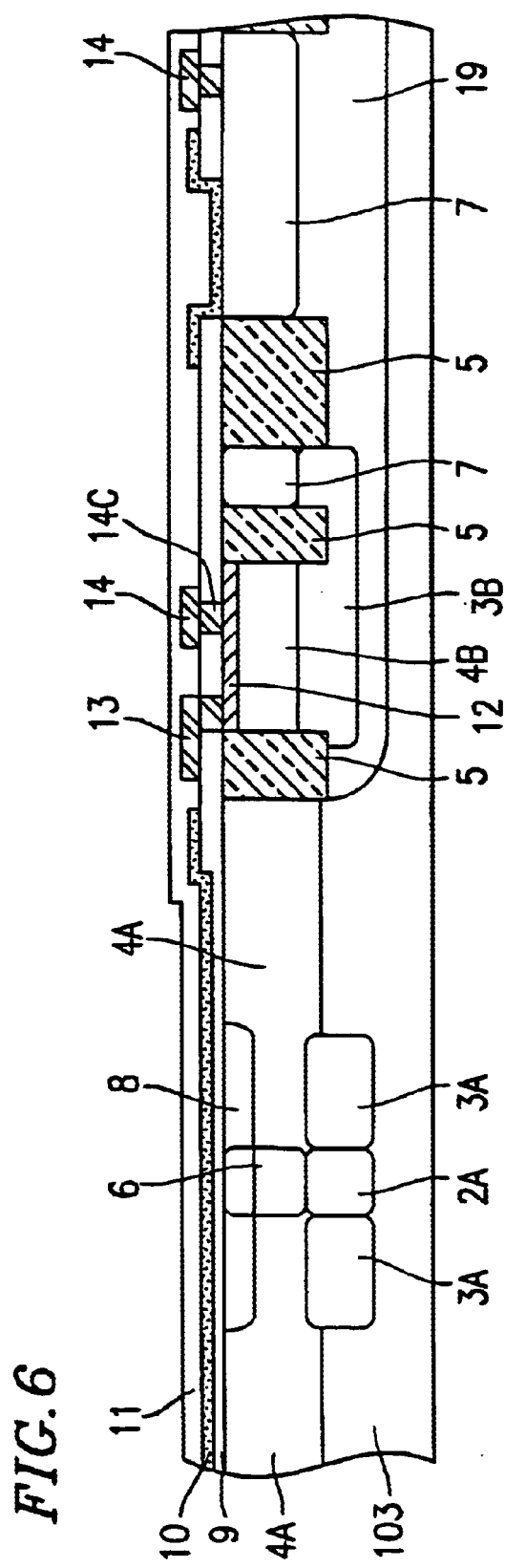
FIG. 6 is a sectional view showing a different step of the method for producing the photodetector with a built-in circuit 100 according to an embodiment of the present invention.

Next, FIG. 6 shows steps of forming the Poly-Si layer 13 for the NPN transistor base electrode by deposition, doping B (boron), and performing photolithography and etching. An emitter region of the V-PNP transistor (not shown) is formed by ion implantation. Thereafter, an NPN transistor emitter diffusion source, and the Poly-Si layer 14 for an electrode having, for example, an SST (Super Self-aligned Technology) structure are formed (step S1007 of FIG. 10).

Figure 7:
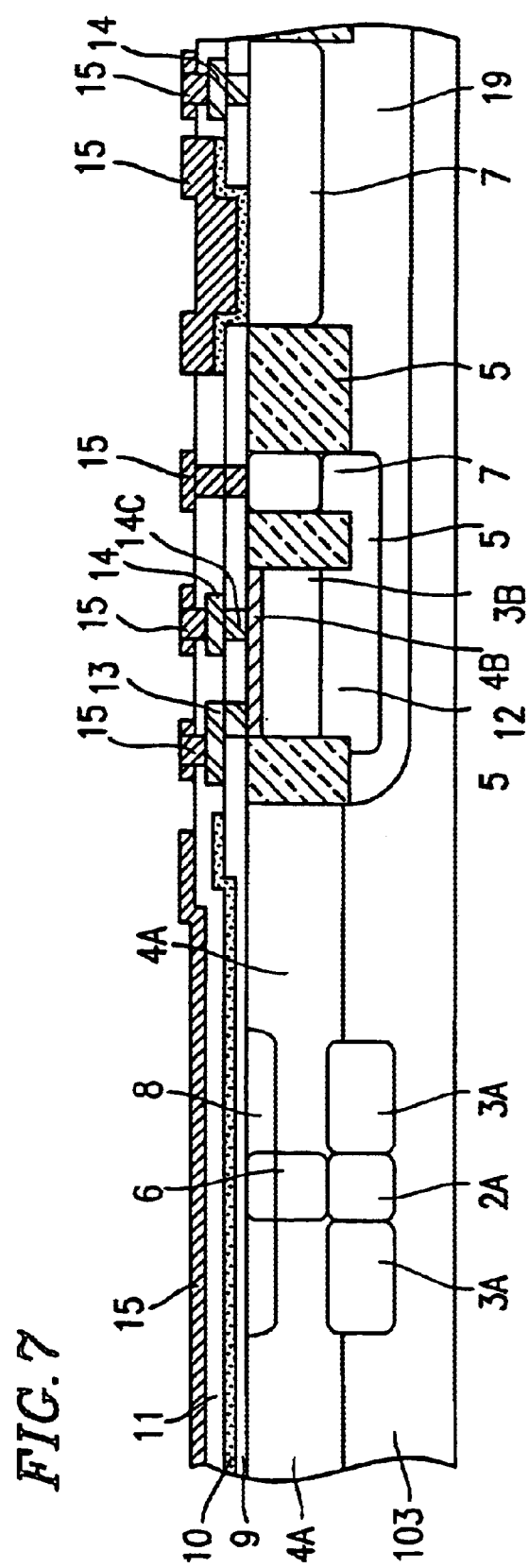
FIG. 7 is a sectional view showing a different step of the method for producing the photodetector with a built-in circuit 100 according to an embodiment of the present invention.

Next, contact holes (not shown) are formed and AlSi/TiW is applied to the entire surface of the silicon oxide film 11 by sputtering. Thereafter, the first-layer conductor 15 is provided by patterning as shown in FIG. 7 (step S1008 of FIG. 10). In this case, the first-layer conductor 15 is dry-etched on the integrated circuit 102, but not on the photodiode 101. The first layer conductor 15 of the photodiode 101 is etched along with the second layer conductor 17 described below. Dry etching is required to narrow the width of the first layer conductor 15 and the second layer conductor 17 for the purpose of an improvement in the packing density of transistors.

Figure 8:
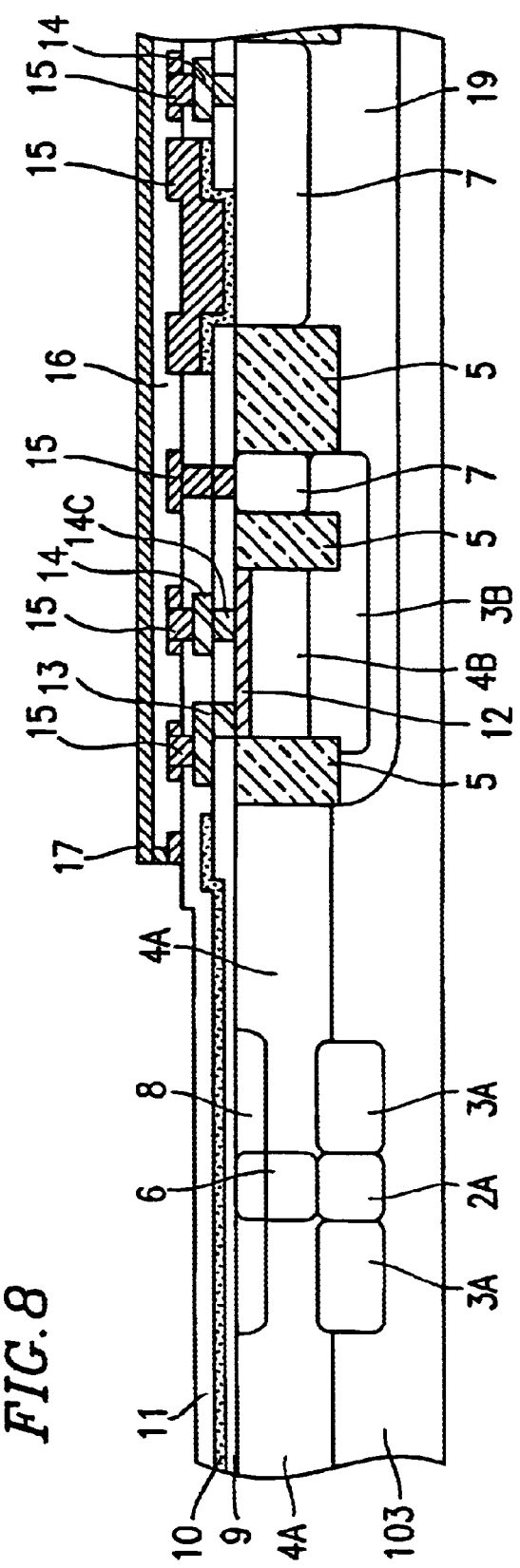
FIG. 8 is a sectional view showing a different step of the method for producing the photodetector with a built-in circuit 100 according to an embodiment of the present invention.

Referring to FIG. 8, the interlayer insulation film 16 formed (step S1009 of FIG. 11). Through holes to the first-layer conductor 15 are made in the interlayer insulation film 16 by photolithography and etching while the interlayer insulation film 16 in the photodiode region is dry-etched (step S1010 of FIG. 11). At this point, the first layer conductor 15 remains in the photodiode region. Therefore, dry etching does not affect the antireflection film. Next, AlSi is applied to the interlayer insulation film 16 by sputtering to form the second conductor 17 (step S1011 of FIG. 11). Thereafter, photolithography is performed and the second layer conductor 17 on the photodiode region is dry-etched (step S1012 of FIG. 11). Since the CVD silicon oxide film 11 is provided on the split photodiode so as to protect the antireflection film, the silicon nitride film 10 of the antireflection film is not made thinner when the second layer conductor 17 on the photodiode region is dry-etched, thereby maintaining an optimal thickness for the antireflection film.

Figure 9:
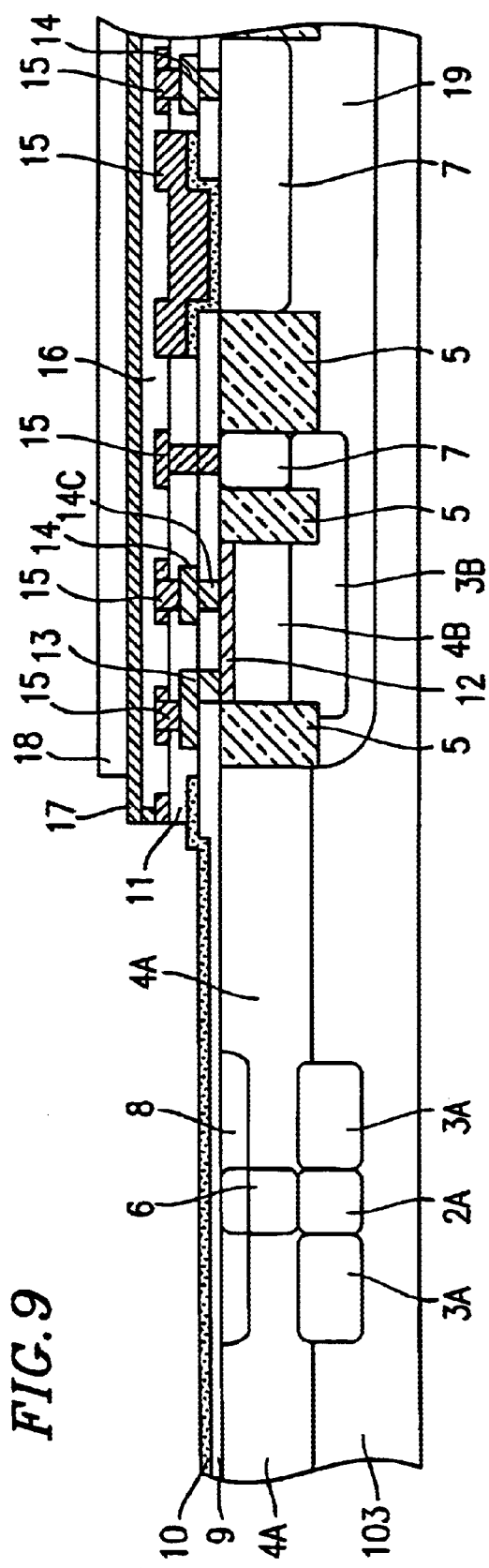
FIG. 9 is a sectional view showing a different step of the method for producing the photodetector with a built-in circuit 100 according to an embodiment of the present invention.

FIG. 9 shows the completed state of the photodetector with a built-in circuit 100 according to the present invention. The cover silicon nitride film 18 as a cover insulation film is formed on the second-layer conductor 17 (step S1013 of FIG. 11). Finally, the cover silicon nitride film 18 is patterned by photolithography and dry etching, and thereafter wet etching is performed on the silicon oxide film 11 used in protecting the silicon nitride film 10 from dry etching (step S1014 of FIG. 11). The cover silicon nitride film 18 serves as a mask during the wet etching.

As described above, since the silicon oxide film 11 is wet-etched after all the dry etching steps are completed, the antireflection film (silicon thermal oxide film 9 and silicon nitride film 10) can be protected from the dry-etching steps. Furthermore, since the cover silicon nitride film 18 to be the cover insulation film serves as a mask when etching is performed, the cost of photolithography can be kept from increasing.

As described above, according to the present embodiment, the SiGe layer 12 is formed after the formation of the antireflection film (silicon thermal oxide film 9 and silicon nitride film 10) is completed, so that the antireflection film can be formed without causing fluctuations in characteristics of the HBT. Therefore, a conductor having a narrow width can be formed by dry etching without deteriorating the photosensitivity of the photodiode 101. As a result, the packaging density of integration of the integrated circuit 102 can be improved.

Figure 14:
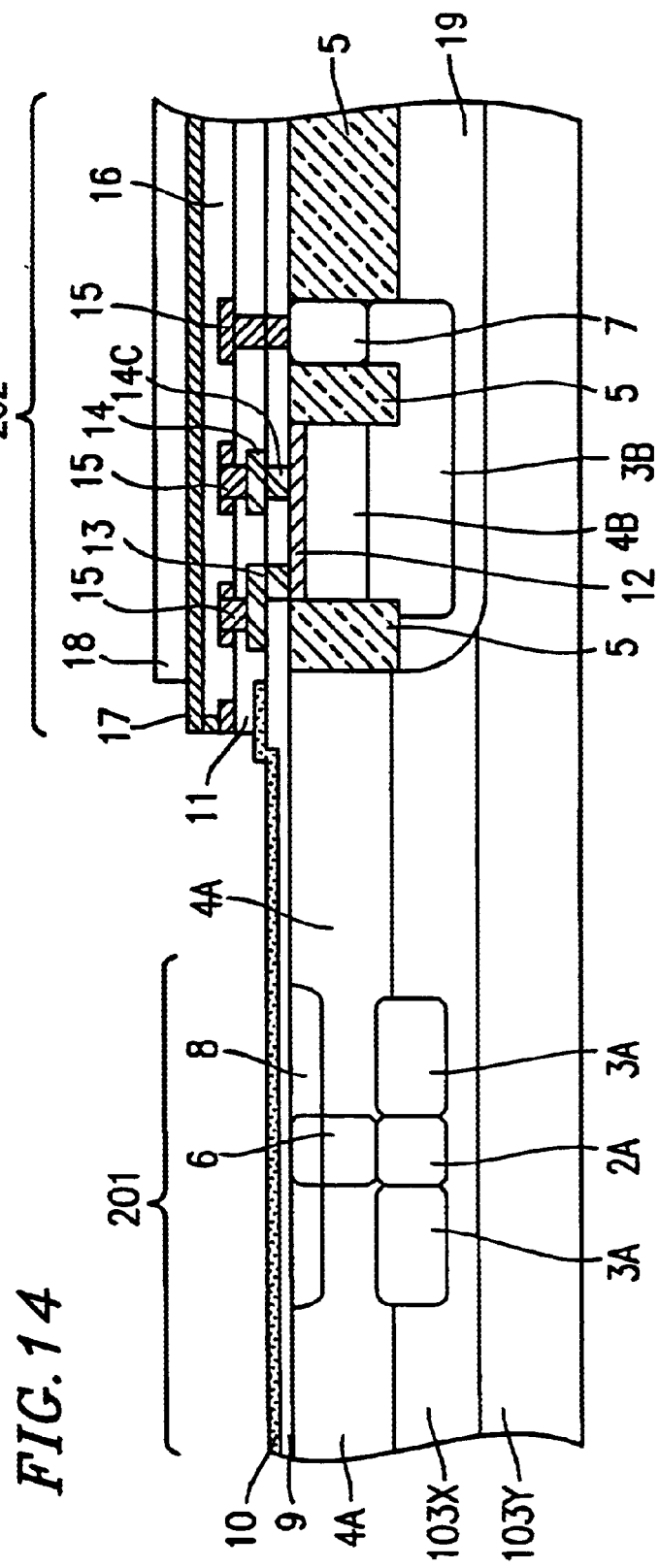
FIG. 14 is a sectional view showing an improvement of a photodetector with a built-in circuit (a split diode and an NPN transistor) according to an embodiment of the present invention.

A photodetector with a built-in circuit 200 according to a variant of the present embodiment will be described with reference to FIG. 14. In FIG. 14, components similar to those of the above-described photodetector with a built-in circuit 100 will be denoted by the same reference numerals, and detailed explanation thereof will thus be omitted.

In the photodetector with a built-in circuit 100, a substrate having a high resistivity (P-type semiconductor substrate 103) is used to reduce the capacitance of the photodiode 101. However, when the resistivity of the substrate is too high, the series resistance of the photodiode becomes high. As a result, a CR time constant component is increased rather than being decreased, thereby deteriorating response.

In order to further speed up the photodiode, a P-type high resistive epitaxial layer 103X (resistivity: about 1000 Ωcm, thickness: about 20 μm) may be formed on a P-type low resistive epitaxial layer 103Y (resistivity: about 4 Ωcm) as shown in FIG. 14. In this structure, the P-type layer at a PN junction is the high resistive epitaxial layer 103X. Therefore, the junction capacitance of the structure including the low resistive substrate can be lower than that in a structure including a high resistive substrate.

In the case of using the high resistive substrate (P-type semiconductor substrate 103) of the photodetector with a built-in circuit 100, it is necessary to keep the series resistance of the photodiode 101 from increasing, so that the resistivity cannot be sufficiently high. However, according to the structure of the photodetector with a built-in circuit 200, a P-type buried diffusion layer 19 is formed in such a manner that the P-type buried diffusion layer 19 reaches the low resistive P-type substrate 103Y, so that the series resistance of the photodiode 201 is determined by the resistance of the P-type low resistive substrate 103Y. As a result, the series resistance can be reduced regardless of the resistivity of the high resistive epitaxial layer 103X. Therefore, the junction capacitance and the series resistance which greatly affect the response of the photodiode 201 both can be reduced, thereby speeding up the photodiode 201.

Figure 15:
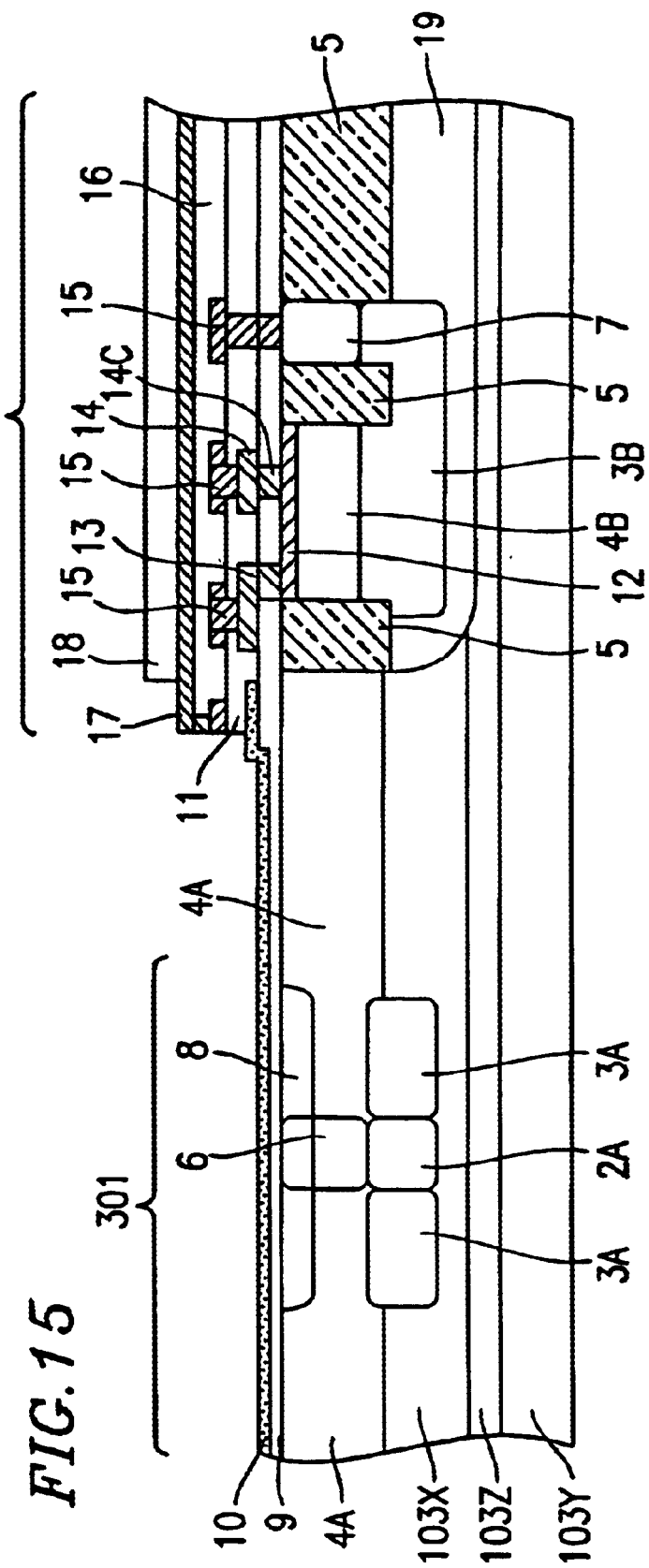
FIG. 15 is a sectional view showing an improvement of a photodetector with a built-in circuit (a split diode and an NPN transistor) according to an embodiment of the present invention.

A photodetector with a built-in circuit 300 according to another variant of the present embodiment will be described with reference to FIG. 15. In order to further speed up the photodiode 301, a P-type low resistive buried diffusion layer 103Z (peak concentration: about $1\times10^{18}$ cm$^{-3}$, thickness: about 15 μm) may be formed on a P-type low resistive substrate 103Y (resistivity: about 40 Ωcm), and a P-type high resistive epitaxial layer 103X (resistivity: 300 Ωcm) may further be formed thereon. As described in conjunction with the structure shown in FIG. 14, the structure of the photodetector with a built-in circuit 300 allows the series resistance of the photodiode 301 to be reduced without increasing the junction capacitance of the photodiode 301.

Furthermore, internal field resulted from upward diffusion in the P-type low resistive buried diffusion layer 103Z allows acceleration of photocarriers, thereby further speeding up the photodiode 301.

Photocarriers generated at a deep position below the P-type low resistive buried diffusion layer 103Z are a component having a slow response though it has the internal field. Therefore, the P-type low resistive substrate 103Y (resistivity: about 40 Ωcm) is employed to provide a high potential barrier such that the photocarriers cannot pass over it. As a result, the photocarriers having a slow response can be eliminated, thereby speeding up the photodiode 301.

As described above, according to the present embodiment, a high-speed integrated circuit employing the heterojunction bipolar transistor which includes a SiGe layer formed in the base region is formed while a photodiode can be formed on the same silicon substrate on which the integrated circuit is formed without deteriorating the response and photosensitivity characteristics of the photodiode. Accordingly, a photodetector with a built-in circuit which has a high response and photosensitivity can be realized.

As described above, the present invention provides a photodetector with a built-in circuit in which an integrated circuit which is sped up by employing an HBT including a SiGe layer and a split photodiode can be formed on the same substrate, and a method for producing such a photodetector.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photodetector with a built-in circuit, comprising:
   a semiconductor substrate;
   an integrated circuit provided on the semiconductor substrate; and
   a photodiode provided on the semiconductor substrate,
   wherein the integrated circuit includes a transistor which comprises a SiGe layer provided on at least a portion of the integrated circuit.

2. A photodetector with a built-in circuit according to claim 1, wherein the photodiode includes a homojunction of Si.

3. A photodetector with a built-in circuit according to claim 1, wherein the photodiode includes a plurality of split photodiodes.

4. A photodetector with a built-in circuit according to claim 1, wherein the photodiode includes an antireflection film provided on the semiconductor substrate and
   the antireflection film includes a silicon thermal oxide film.

5. A photodetector with a built-in circuit according to claim 4, wherein the antireflection film further includes a silicon nitride film.

6. A photodetector with a built-in circuit according to claim 4, wherein a thickness of the silicon thermal oxide film is between about 10 nm or more and about 40 nm or less.

7. A photodetector with a built-in circuit according to claim 1, wherein the semiconductor substrate includes a first conductivity-type semiconductor having a high resistivity.

8. A photodetector with a built-in circuit according to claim 1, wherein the semiconductor substrate includes:
   a first conductivity-type semiconductor substrate having a low resistivity; and
   a first conductivity-type epitaxial layer provided on the first conductivity-type semiconductor substrate which has a resistivity higher than that of at least the first conductivity-type semiconductor substrate.

9. A photodetector with a built-in circuit according to claim 1, wherein the semiconductor substrate includes:
   a first conductivity-type semiconductor substrate having a low resistivity;
   a first conductivity-type semiconductor layer provided on the first conductivity-type semiconductor substrate which has a resistivity lower than that of at least the first conductivity-type semiconductor substrate; and
   a first conductivity-type epitaxial layer provided on the first conductivity-type semiconductor layer which has a resistivity higher than that of at least the first conductivity-type semiconductor substrate.

10. The photodetector of claim 1, wherein the transistor is a heterojunction bipolar transistor (HBT), so that the SiGe layer is part of an HBT.

11. A photodetector device comprising:
   a semiconductor substrate;
   an integrated circuit provided on the semiconductor substrate;
   a photodiode provided on the semiconductor substrate; and
   wherein the integrated circuit includes a transistor which comprises a layer comprising SiGe provided for at least a portion of the integrated circuit.

12. The photodetector device of claim 11, wherein the transistor is a heterojunction bipolar transistor (HBT), so that the layer comprising SiGe is part of an HBT.

* * * * *